United States Patent [19]

Peterson

[11] Patent Number: 4,990,860
[45] Date of Patent: Feb. 5, 1991

[54] APPARATUS FOR MEASURING THE NUMBER OF TURNS OF A TOROIDAL COIL

[75] Inventor: Meredith P. Peterson, Burlington, Mass.

[73] Assignee: Third Wave Instruments, Inc., Burlington, Mass.

[21] Appl. No.: 409,825

[22] Filed: Sep. 20, 1989

[51] Int. Cl.⁵ ............................................. G01R 31/02
[52] U.S. Cl. ..................................... 324/726; 324/546; 324/225
[58] Field of Search ............... 324/726, 654, 656, 601, 324/546, 547, 200, 202, 225, 239

[56] References Cited

U.S. PATENT DOCUMENTS 3,953,791  4/1976  Spurr et al. ....................... 324/727

FOREIGN PATENT DOCUMENTS 0214216  10/1984  Fed. Rep. of Germany ........ 324/55
2019015  10/1979  United Kingdom ................. 324/55

OTHER PUBLICATIONS

Ash, High Speed Coil Turn Testing, 4-1982, pp. 36-38, Insulation/Circuits, vol. 28, No. 4.

Primary Examiner—Reinhard J. Eisenzopf
Assistant Examiner—Jack B. Harvey
Attorney, Agent, or Firm—Fish & Richardson

[57] ABSTRACT

Apparatus for measuring the number of turns on a toroidal coil includes a conductive member adapted to receive the coil to be tested; circuitry for energizing the coil to be tested including an oscillator and coupler circuitry connected in circuit between the oscillator and the coil energizing terminals; and circuitry connected to the conductive member including a comparator having first and second inputs and an output. Circuitry responsive to the connection of the conductor member in circuit applies a reference voltage signal to a first input of the comparator; circuitry responsive to the voltage induced in the conductive member by the energized toroidal coil to be tested applies a signal proportional to the induced voltage to the second input of the comparator; and circuitry responsive to the output of the comparator stabilizes the voltage applied from the oscillator to the toroidal coil when the input signals to the comparator are equal. An output device responsive to the voltage applied to the toroidal coil provides an output indicative of a number of turns on the coil under test.

20 Claims, 3 Drawing Sheets

APPARATUS FOR MEASURING THE NUMBER OF TURNS OF A TOROIDAL COIL

This invention relates to apparatus for measuring the number of turns on a toroidal coil.

It is frequently desirable to ascertain the number of turns on a toroidal coil, such as a small transformer, a choke or a relay coil. Such coils have different dimensions and may include cores of materials of different permeabilities.

In accordance with the invention there is provided apparatus for measuring the number of turns of a toroidal coil that includes structure adapted to receive the coil to be tested, circuitry for energizing the coil to be tested including an oscillator for generating an AC signal for application to the coil under test, and a voltage control connected in circuit between the oscillator and the coil under test for varying the voltage applied to the coil under test, circuitry for establishing a secondary circuit through a toroidal coil on the coil receiving structure, circuitry connected to the secondary circuit establishing circuitry including circuitry responsive to the voltage induced in the secondary circuit establishing circuitry by the coil energizing circuitry, a reference voltage source, comparator circuitry responsive to the reference voltage source and the induced voltage circuitry for varying the voltage control, and circuitry for stabilizing the voltage control when the reference voltage and induced voltage signals to the comparator circuitry are equal; and an output responsive to the AC signal applied to the coil for providing an indication of the number of turns on the coil as a function of the AC signal applied to the coil being measured.

In particular embodiments, the secondary circuit establishing circuitry includes a single turn conductive member of conical configuration that projects about the coil receiving structure and receives the coil, and the circuitry for connecting the conical conductive member in circuit includes a grounding device. Preferably, the comparator circuitry includes an operational amplifier with a first input from the voltage induced in the secondary circuit establishing circuitry and a second input from the reference voltage source, and capacitance (preferably at least about one microfarad) connected in circuit between the output of the operational amplifier and its first input.

In preferred embodiments, the voltage control includes a photoresistor and a photodiode in optically coupled relation to the photoresistor is responsive to the output signal from the comparator circuitry, the AC signal has a frequency greater than one hundred hertz, and the output includes a digital voltmeter that indicates the number of turns of the coil under test as a function of the voltage applied to that coil. A power amplifier connected in circuit between the voltage control and the coil under test supplies sufficient current to the coil under test to compensate for permeability characteristics of the core of the coil under test.

In a particular embodiment, the secondary circuit establishing circuitry includes a metal cone that has a height of less than four inches and a diameter at its base of at least one-half inch, the circuitry for connecting the metal cone in circuit includes a grounding device, and the reference voltage is applied to the operational amplifier in response to the connection of the metal cone in circuit by the grounding device.

The analyzer is easy and versatile in operation, and quickly and simply provides accurate indications of the number of turns on the toroidal coil being measured.

Other features and advantages will be seen as the following description of particular embodiments progresses, in conjunction with the drawings, in which.

DESCRIPTION OF PARTICULAR EMBODIMENTS

Figure 1:
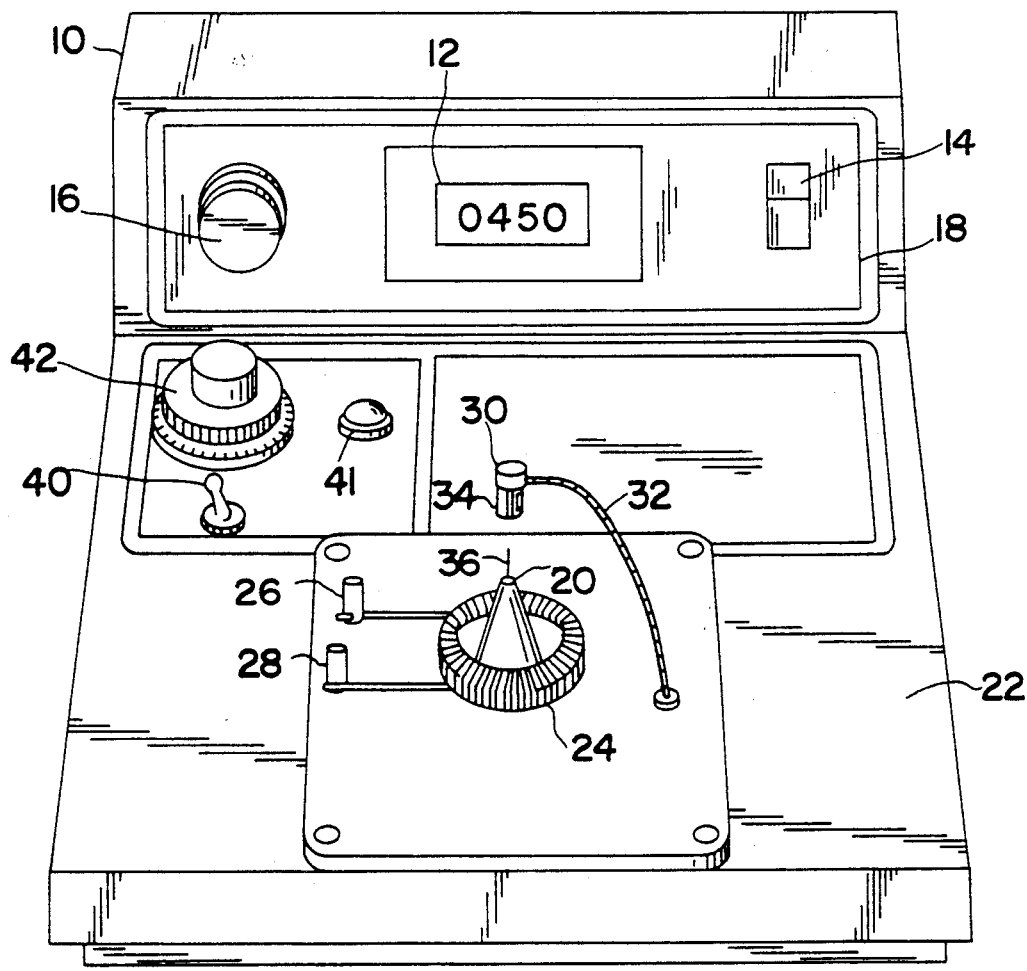
FIG. 1 is a perspective view of an analyzer in accordance with the invention.

Shown in FIG. 1 is an analyzer for measuring the actual number of turns of wire on a toroidal coil that includes housing 10 with display 12, on/off switch 14 and indicator light 16 on upper panel 18. A conical conductive member 20 in the center of lower panel 22 is adapted to receive a coil 24 to be tested. The leads of coil 24 are connected to terminal posts 26, 28. A connector member 30 supported on spring 32 carries clip 34 for attachment to wire 36 that projects from the upper end of cone 20. In another embodiment, panel 22 has an aperture and a terminal connection is located below the plane of panel 22 and accessible through that aperture, and connector member 30 is connected to that terminal after the coil to be tested is positioned on panel 22. In the illustrated panel above cone 20 is "normal-relative" switch 40, indicator 41, and potentiometer control 42 that inserts compensating resistance in circuit when switch 40 is in the "relative" position.

Figure 2:
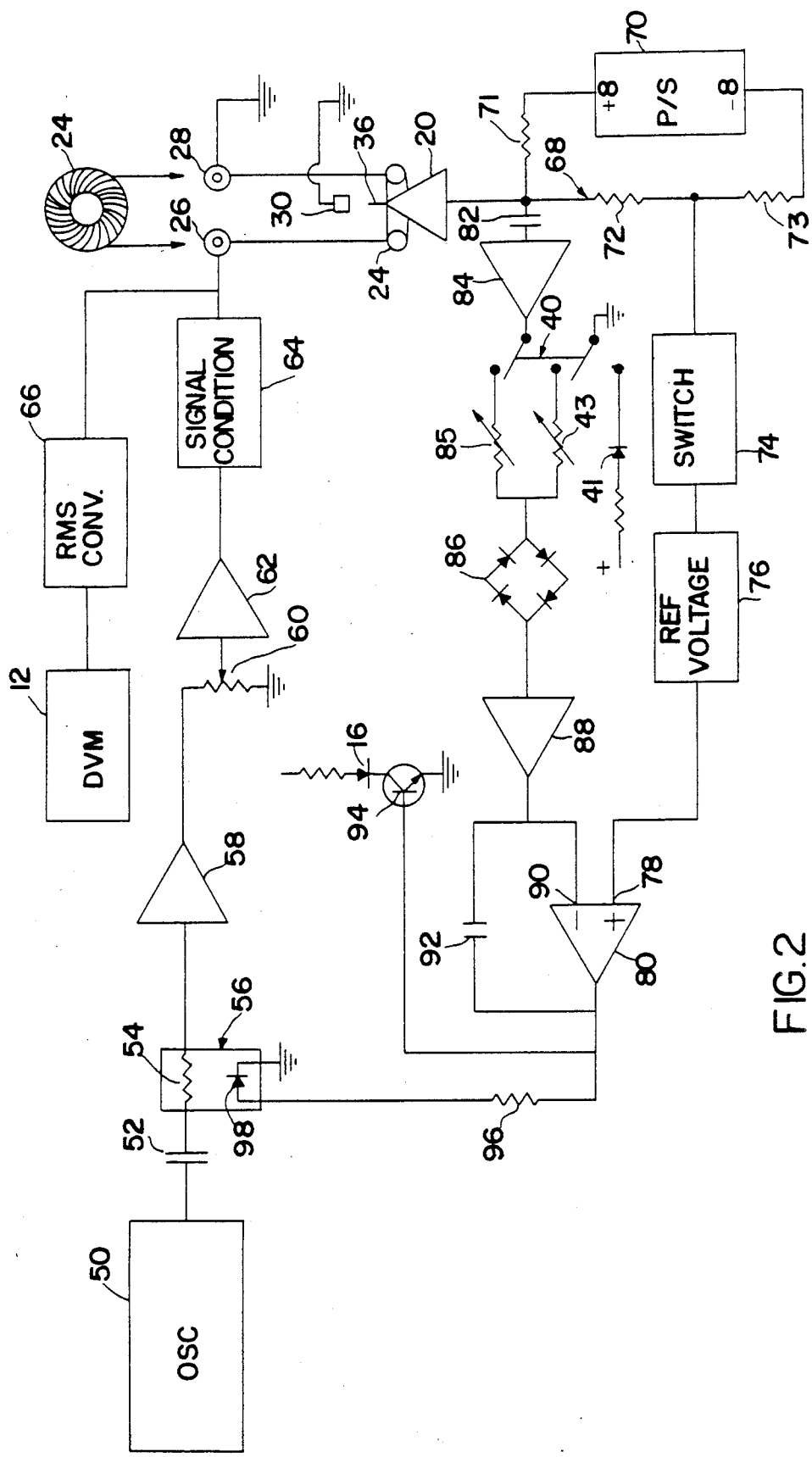
FIG. 2 is a block diagram of the circuitry of the analyzer shown in FIG. 1.

Further details of the analyzer may be seen with reference to the block diagram of FIG. 2. The analyzer includes oscillator 50 which applies an AC signal through coupling capacitor 52 to photoresistor 54 of coupler 56. The output of photoresistor 54 is connected through buffer amplifier 58 to drive level adjust 60 and its output is connected through power amplifier 62 and signal conditioning network 64 to terminal 26. The signal applied to terminal 26 is also applied through RMS converter 66 to digital display 12.

Toroidal coil receiving cone 20 has an output terminal connected to divider network 68. Divider network 68 is connected to power supply 70 and includes resistors 71–73, and has an output connected to switch 74 which operates reference voltage source 76 to apply a 2½ volt signal to input 78 of stabilized comparator 80. A second circuit from divider network 68 includes coupling capacitor 82, amplifier 84, "normal-relative" select switch 40, converter bridge 86, and amplifier 88 (to provide a gain of 2500), and is connected to terminal 90 of comparator 80. The output of comparator 80 is fed back through stabilizing capacitance 92 to input terminal 90, applied through transistor 94 to indicator 16 and through resistor 96 to photodiode 98 of coupler 56.

Figure 3:
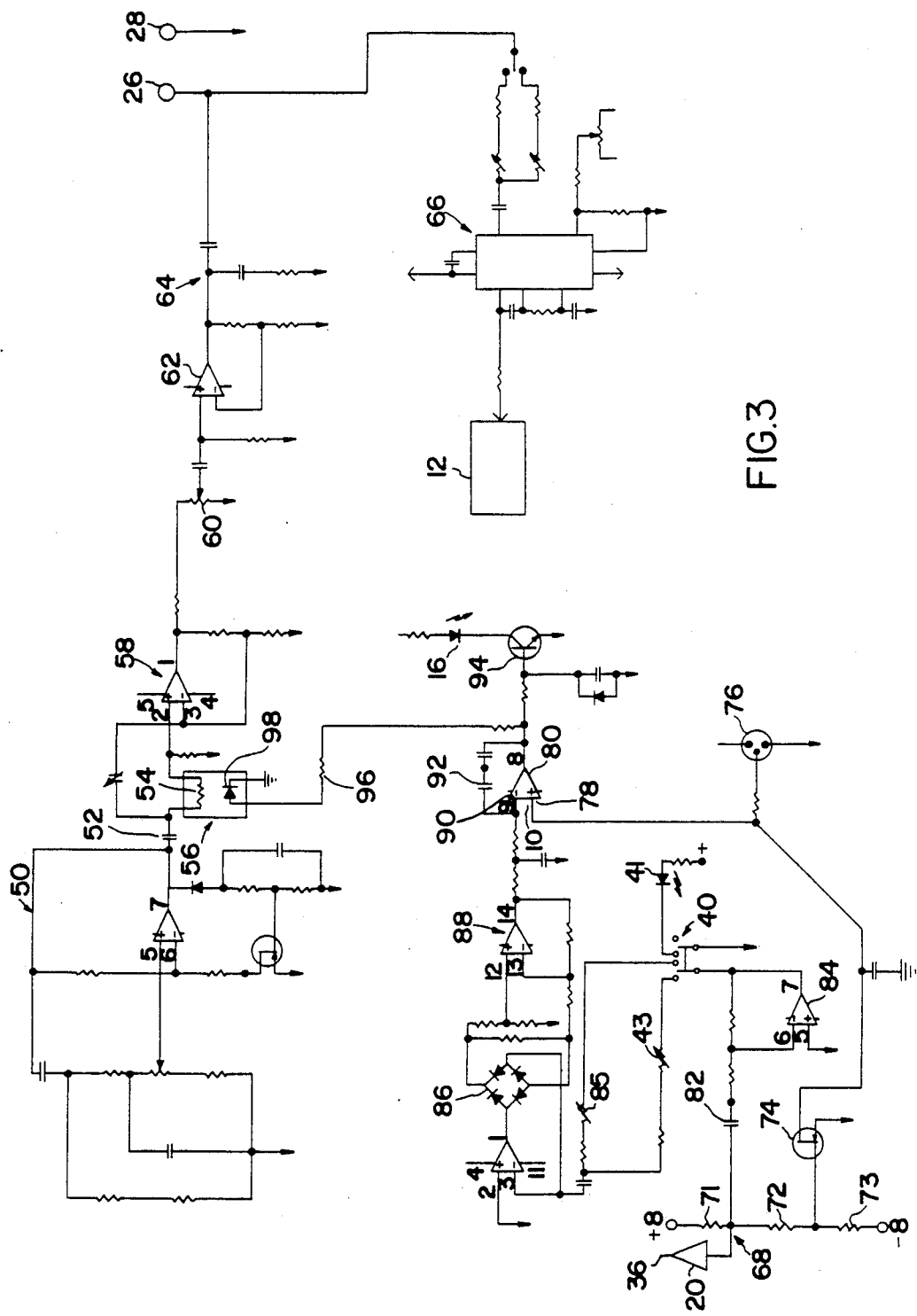
FIG. 3 is a detailed schematic diagram of the circuitry shown in FIG. 2.

A particular embodiment of the analyzer is shown in FIG. 3. That embodiment includes Wein bridge oscillator 50 which produces a 20 kilohertz output through coupling capacitor 52 to photocoupler 56 (Clairex CLM 51) whose photoresistor 54 has a 20 megohm resistance in off condition and is coupled to buffer amplifier 58. (In another embodiment, oscillator 50 produces an output at a frequency of about 380 hertz.) The output of amplifier 58 coupled through drive level adjust potentiometer 60 to power amplifier 62 and signal conditioning network 64 to apply 2½ volt maximum signal to binding post 26. RMS converter 66 is coupled between the output line and the display 12.

Cone 20 (which this particular embodiment is an aluminum member one inch high and three quarter inch in diameter at its base and has connection wire 36 at its apex) is connected to voltage divider network 68. (In another embodiment, cone 20 is three inches high and three and one-half inches in diameter at its base, and in still another embodiment, a terminal is located below an aperture in the coil support panel 22.) Connected across resistors 71–73 of network 68 is power supply 70. One output of network 68 is connected to transistor switch 74 which in a conductive condition clamps voltage source 76 at ground. When cone wire 36 is grounded by clip 30, transistor 74 is turned off so that the 2.5 volt reference signal is applied at terminal 78 of LM837 comparator 80. A second output from the voltage divider network 68 is supplied through coupling capacitor 82 and amplifier 84 to switch 40. In the "normal" position of switch 40, the signal from divider network 68 is applied through amplifier 84 to variable resistor 85, bridge rectifier 86 and amplifier 88 to provide a gain of 2500. The amplified output voltage is applied to input 90 of comparator 80. The comparator output is applied through resistor 96 to photodiode 98 of coupler 56, is fed back through the two microfarad stabilizing capacitors 92, and also applied to transistor 94 to energize light emitting diode 16. In the "relative" position of switch 40, the signal from divider network 68 is applied through variable resistor 43 (controlled by knob 42), and indicator diode 41 is also energized.

In analyzer operation, a toroidal coil 24 to be tested is placed on conductive cone 20 and its terminals are connected to binding posts 26 and 28. Energization of the circuit applies a six volt signal from oscillator 50 through coupling capacitor 52 and photoresistor 54 to buffer amplifier 58. When clip 30 is attached to conductive wire 36, the cone 20 acts as a single turn secondary of a transformer and the resulting induced voltage is coupled through the resistive divider network 68 to turn off transistor 74 and allow the 2½ volt DC reference voltage from source 76 to be applied to terminal 78 of comparator 80. The output of comparator 80 through resistor 96 energizes photodiode 98 to reduce the resistance of photoresistor 54. As the twenty kilohertz voltage applied from oscillator 50 through binding post 26 to the toroidal coil 24 under test ramps up, the voltage induced in the single turn secondary (cone 20) increases and is rectified and amplified with a gain of 2500 and applied to input 90 of comparator 80. When the signals on inputs 78 and 90 of comparator 80 are equal, the circuit stabilizes the signal applied to diode 98 so that the output voltage at binding post 26 from coupler 56 is maintained at the value that induces the one millivolt signal in the single-turn secondary. The stabilized voltage at binding post 26 is equal (in millivolts) to the number of turns on the toroidal coil under test, and is displayed (in millivolts and in coil turns) at output 12.

For example, if the coil 24 under test has 1,000 turns, when a one-volt signal is applied through post 26 to the coil, a one millivolt signal is applied to cone 20 and amplified by amplifiers 84, 88 to provide a 2½ volt input signal to input 90 of comparator 80 that equals the 2½ volt reference and produces the stabilized coil measuring condition with 1000 on display 12. Similarly, if coil 24 has 600 turns, a one millivolt signal is induced in the single turn secondary of cone 20 when a 600 millivolt input is at post 26; and if the coil under test has 1700 turns, the voltage at binding post 26 must be 1.7 volts to induce one millivolt in the single turn secondary of cone 20.

The voltage from comparator 80 decreases as the difference between the two inputs decreases and when the inputs are equal, the output from the comparator 80 is feedback stabilized and the photocoupler 56 maintains at binding post 26 the voltage that produces the one millivolt induced voltage in cone 20. That stabilized binding post voltage is measured and displayed at display 12 and directly indicates the number of turns on the coil 24 under test.

While particular embodiments of the invention has been shown and described, various modifications will be apparent to those skilled in the art, and therefore, it is not intended that invention be limited to the disclosed embodiments, or to details thereof, and departures may be made therefrom within the spirit and scope of the invention.

What is claimed is:

1. Apparatus for measuring the number of turns of a toroidal coil comprising
   structure adapted to receive the coil to be tested,
   circuitry for energizing the coil to be tested including an oscillator for generating an AC signal for application to the coil under test, and a voltage control connected in circuit between said oscillator and the coil under test for varying the voltage applied to the coil under test;
   circuitry for establishing a secondary circuit through a toroidal coil on said coil receiving structure,
   circuitry connected to said secondary circuit establishing circuitry including circuitry responsive to the voltage induced in said secondary circuit establishing circuitry by said coil energizing circuitry, a reference voltage source, comparator circuitry responsive to said reference voltage source and said circuitry responsive to the voltage induced in said secondary circuit establishing circuitry for varying said voltage control, and circuitry for stabilizing said voltage control when signals to said comparator from said reference voltage source and from said circuitry responsive to the voltage induced in said secondary circuit establishing circuitry are equal; and
   an output responsive to the AC signal applied to the coil for providing an indication of the number of turns on the coil as a function of the AC signal applied to the coil being measured.

2. The analyzer of claim 1 wherein said secondary circuit establishing circuitry includes a single turn conductive member that projects above said coil receiving structure and receives the coil.

3. The analyzer of claim 2 wherein said conductive member is of conical configuration and said secondary circuit establishing circuitry includes a grounding device.

4. The analyzer of claim 1 wherein said comparator circuitry includes an operational amplifier with a first input from the voltage induced in said secondary circuit establishing circuitry and a second input from said reference voltage source.

5. The analyzer of claim 4 and further including capacitance connected in circuit between the output of said operational amplifier and an input thereof.

6. The analyzer of claim 1 wherein said voltage control includes a photoresistor, and a photodiode in optically coupled relation to said photoresistor and responsive to the output signal from said comparator circuitry.

7. The analyzer of claim 1 wherein said AC signal has a frequency greater than one hundred hertz.

8. The analyzer of claim 1 wherein said output includes a digital voltmeter, and said voltmeter indicates the number of turns of the coil under test as a function of the voltage applied to that coil.

9. The analyzer of claim 1 and further including a power amplifier connected in circuit between said voltage control and the coil under test for supplying sufficient current to the coil under test to compensate for permeability characteristics of the core of the coil under test.

10. The analyzer of claim 9 wherein said comparator circuitry includes an operational amplifier with a first input from the voltage induced in said secondary circuit establishing circuitry and a second input from said reference voltage source.

11. The analyzer of claim 10 and further including at least about one microfarad of capacitance connected in circuit between the output of said operational amplifier and an input thereof.

12. The analyzer of claim 11 wherein said voltage control includes a photoresistor, and a photodiode in optically coupled relation to said photoresistor and responsive to the output signal from said comparator circuitry 13. The analyzer of claim 12 wherein said AC signal has a frequency greater than one hundred hertz.

14. The analyzer of claim 1 wherein said secondary circuit establishing circuitry includes a metal cone that has a height of less than four inches and a diameter at its base of at least one-half inch, and said secondary circuit establishing circuitry includes a grounding device.

15. The analyzer of claim 14 and further including circuitry for applying voltage from said reference voltage source to said comparator circuitry in response to the connection of said metal cone in circuit by said grounding device.

16. The analyzer of claim 15 wherein said output includes a digital voltmeter, and said voltmeter indicates the number of turns of the coil under test as a function of the voltage applied to that coil.

17. The analyzer of claim 16 and further including a power amplifier connected in circuit between said voltage control and the coil under test for supplying sufficient current to the coil under test to compensate for permeability characteristics of the core of the coil under test 18. The analyzer of claim 17 wherein said comparator circuitry includes an operational amplifier with a first input from the voltage induced in said cone and a second input from said reference voltage source, and further including at least about one microfarad of capacitance connected in circuit between the output of said operational amplifier and said first input thereof.

19. The analyzer of claim 18 wherein said voltage control includes a photoresistor, and a photodiode in optically coupled relation to said photoresistor and responsive to the output signal from said operational amplifier.

20. The analyzer of claim 1 wherein said circuitry responsive to the voltage induced in said secondary circuit establishing circuitry includes an operator-adjustable control, a variable resistance connected to said operator-adjustable control and switch means for connecting said variable resistance in said circuitry responsive to the voltage induced in said secondary circuit establishing circuitry.

* * * * *